(12) United States Patent  
Okimoto et al.

(10) Patent No.: US 7,876,553 B2  
(45) Date of Patent: Jan. 25, 2011

(54) FLAT-PANEL DISPLAY APPARATUS

(75) Inventors: Mitsuo Okimoto, Chigasaki (JP); Mikio Shiraishi, Yokohama (JP); Takaaki Matono, Yokohama (JP); Yoshie Kodera, Chigasaki (JP); Toshihiko Matsuzawa, Kamakaura (JP); Sadayuki Nishimura, Yokohama (JP); Nobuo Masuoka, Chigasaki (JP)

(73) Assignee: Hitachi, Ltd., Tokyo (JP)

( * ) Notice: Subject to any disclaimer, the term of this patent is extended or adjusted under 35 U.S.C. 154(b) by 943 days.

(21) Appl. No.: 11/640,847

(22) Filed: Dec. 19, 2006

(65) Prior Publication Data

US 2007/0153458 A1 Jul. 5, 2007

(30) Foreign Application Priority Data

Dec. 19, 2005 (JP) ............................. 2005-364215  
Mar. 14, 2006 (JP) ............................. 2006-068468

(51) Int. Cl.  
*H05K 5/00* (2006.01)  
*H05K 7/00* (2006.01)

(52) U.S. Cl. ............................. 361/679.21; 361/679.46; 361/704

(58) Field of Classification Search ............ 361/679.46, 361/704, 679.21–79.3  
See application file for complete search history.

(56) References Cited

U.S. PATENT DOCUMENTS 5,952,782 A * 9/1999 Nanto et al. ................ 313/584

| | | | |
|---|---|---|---|
| 7,323,808 B2 * | 1/2008 | Kim et al. ................ | 313/44 |
| 2005/0047067 A1 * | 3/2005 | Bang et al. ............... | 361/681 |
| 2005/0073253 A1 | 4/2005 | Lin | |
| 2005/0077835 A1 | 4/2005 | Kim | |
| 2005/0258749 A1 * | 11/2005 | Ahn ........................ | 313/582 |
| 2007/0018265 A1 * | 1/2007 | Koeda et al. .............. | 257/435 |

FOREIGN PATENT DOCUMENTS

| | | |
|---|---|---|
| EP | 1 548 691 | 6/2005 |
| JP | 10-198287 | 7/1998 |
| JP | 2001-011402 | 1/2001 |
| JP | 2002-277185 | 9/2002 |
| JP | 2004-333904 | 11/2004 |

* cited by examiner

*Primary Examiner*—Jayprakash N Gandhi  
*Assistant Examiner*—Anthony M Haughton  
(74) *Attorney, Agent, or Firm*—Antonelli, Terry, Stout & Kraus, LLP.

(57) ABSTRACT

According to the present invention, the amount of usage of a heat conductive member for fixing a self-luminous flat display panel to a metallic chassis member disposed at the back of the display panel is reduced in the thickness direction as well as in the surface direction. The invention further provides a technique for efficiently radiating heat from the display panel, suppressing cost increase. To this end, in the invention, the heat conductive member is a hot-melt adhesive having adhesion at room temperature and filled with a heat conduction imparting agent, and the display panel is fixed to the chassis member by a plurality of heat conducting sections of the heat conductive member formed discretely ranging from 0.3 to 0.8 mm in thickness.

20 Claims, 11 Drawing Sheets

FIG.2
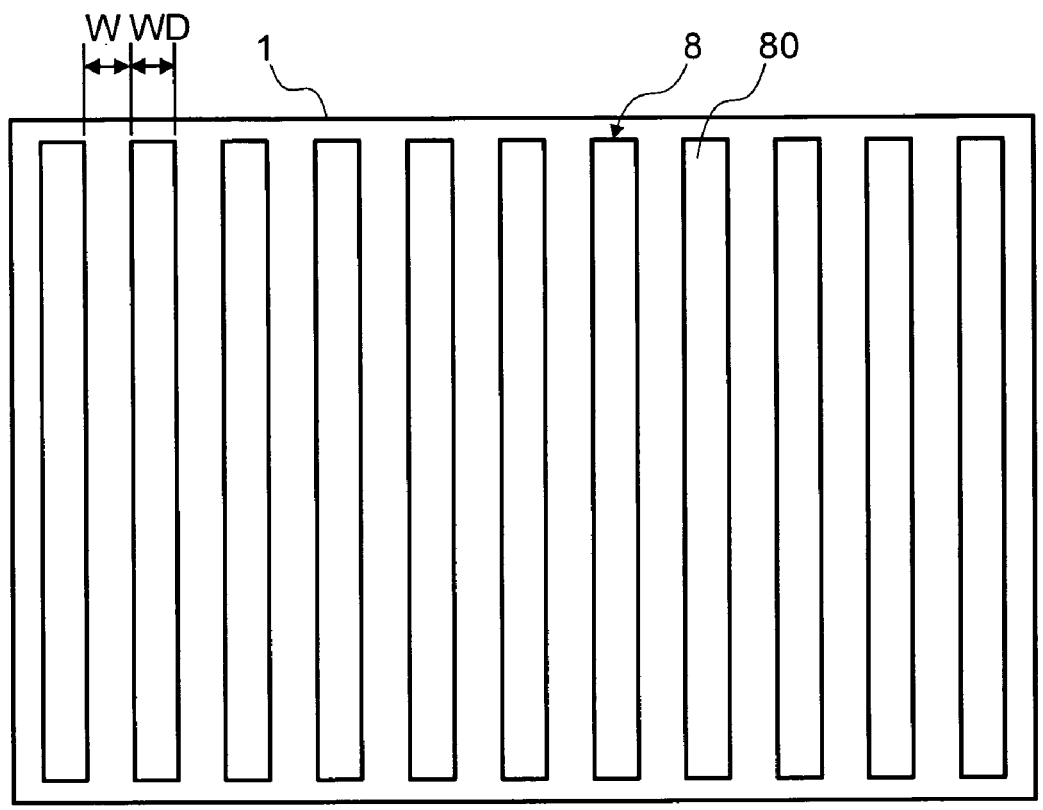
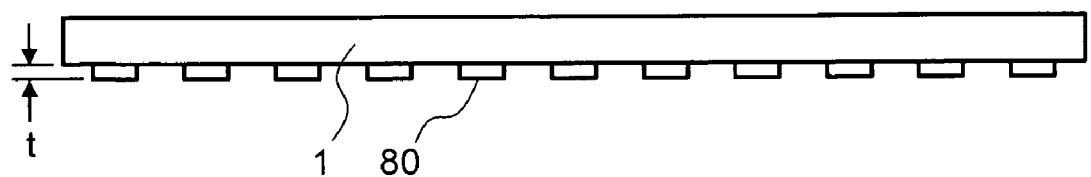

FLAT-PANEL DISPLAY APPARATUS

BACKGROUND OF THE INVENTION

1. Field of the Invention

The present invention relates to a flat-panel display apparatus equipped with a flat display panel where self-luminous pixels are arranged between opposing substrates, and more particularly to a display apparatus in which schemes for efficiently radiating heat from a display panel are employed.

2. Description of the Related Art

Self-luminous flat display panels include a plasma display panel (hereinafter referred to as a "PDP"), a field emission display panel, an organic electroluminescence panel, and an LED display panel structured by arranging LEDs in two-dimensional form.

In display apparatuses equipped with these self-luminous flat display panels, there are employed schemes for efficiently radiating heat from such a panel. Since PDPs generate particularly high heat, a chassis member made of metal (usually aluminum) is generally provided at the back of a PDP in a display apparatus equipped with the PDP, and the PDP and the chassis member are bonded together by a bonding member (heat conductive member) having adhesion. Heat generated at the PDP is conducted to the chassis member, and then radiated outside the apparatus, using a fan or the like.

Usually, a resin composition such as acrylic, urethane, or silicon is molded into a sheet-shaped or tape-shaped heat conductive member, which is used to bond the PDP as a display panel and the chassis member together. At this time, air bubbles come in between the heat conductive member and the PDP or between the heat conductive member and the chassis member, thus reducing the adhesion between the heat conductive member and the PDP or between the heat conductive member and the chassis member and reducing the heat conductivity. For example, Japanese Unexamined Patent Publication No. 2001-11402 proposes a heat conductive sheet having a plurality of grooves for releasing air so as not to produce air bubbles at the time of bonding. There is known a technique for further lessening a bond area and enhancing recycling performance in order to lessen the amount of usage of the heat conductive member for cost reduction as well as reducing the incorporation of air bubbles described in Japanese Unexamined Patent Publication No. 2004-333904, which discloses that the back of a PDP and a metallic (aluminum) chassis member are bonded together through a plurality of heat conductive adhesives shaped like lines and heat generated at the PDP is conducted to the chassis member through the adhesives to be radiated.

The heat conductive member is required to be able to absorb the difference in thermal expansion coefficient between the glass panel of the PDP and the chassis member. For this reason, the breaking elongation of the heat conductive member is usually 50% or more for example as described in Japanese Unexamined Patent Publication No. 2002-277185.

SUMMARY OF THE INVENTION

Generally, plasma display apparatuses have heat conductive members ranging from 1 to 2 mm in thickness. The reasons are as follows.

(1) In the case of using a sheet-shaped or tape-shaped heat conductive member, if the thickness is small, air bubbles often remain on either surface of the glass panel of the PDP or the chassis member at the time of a bonding process, which causes unevenness of heat radiation characteristics and unevenness of adhesion.

(2) The glass panel of the PDP and the metallic (e.g., aluminum) chassis member differ in thermal expansion coefficient. The difference in thermal expansion coefficient acts as shear stress on the heat conductive member, and the shear stress propagates along both the bond surfaces of the glass panel and the chassis member. Since the glass panel is sensitive to shear stress, the heat conductive member is required to absorb the difference in thermal expansion coefficient.

In order to satisfy (1) and (2), the thickness of the heat conductive member is usually 1 mm or more. If the thickness exceeds 2 mm or more, heat conduction to the chassis member deteriorates; therefore, the thickness is 2 mm or less.

In order to further reduce costs, the thickness of the heat conductive member is preferably 1 mm or less; however, this is not taken into consideration in the above-mentioned conventional techniques.

According to Japanese Unexamined Patent Publication No. 2004-333904, fluid heat conductive adhesives are applied at a time, which simplifies the process and thereby reduces costs, compared to the case where the sheet-shaped or tape-shaped heat conductive member is applied. Further, the heat conductive adhesives are applied in reed shapes with a predetermined space therebetween, which reduces the amount of usage of the heat conductive member and thereby reduces costs as well. If the breaking elongation of the heat conductive member is 100% or more, it is possible to reduce the thickness of the heat conductive member to 1 mm or less, which further reduces the amount of usage of the heat conductive member in the thickness direction and thereby reduces costs, as described above; however, this is not described either.

Although the fluid heat conductive member is not described in detail in Japanese Unexamined Patent Publication No. 2004-333904, applying a fluid material obtained by dissolving a resin composition such as silicon or acrylic in an organic solvent usually requires dying, for example, about for 20 minutes at 60° C. in the process. This drying process causes an increase in cost.

In the case of applying fluid heat conductive members, the viscosity (fluidity) is an important factor. As the amount of heat conduction imparting agent (also referred to as heat conduction filler) is increased for better heat conduction to secure the thickness of the heat conductive member, the viscosity increases and the fluidity deteriorates. This degrades the coating properties, and causes an increase in cost. In this respect as well, it is desirable that the thickness of the heat conductive member be small. However, the coating properties are not taken into consideration sufficiently in Japanese Unexamined Patent Publication No. 2004-333904.

Higher definition and higher brightness are required of display apparatuses equipped with a PDP, and the heating value of the PDP may increase with higher definition and higher brightness. Accordingly, it is desirable that heat radiation be performed more efficiently than in the technique described in Japanese Unexamined Patent Publication No. 2004-333904.

It is not preferable in terms of cost to increase the amount of usage of the adhesives (i.e., increase the contact area between the bonding member and the PDP or the chassis member) or use adhesives having high heat conductivity for the purpose of enhancing the heat conductivity.

It is an object of the present invention to provide a flat-panel display apparatus having excellent cost performance, and more specifically, to provide a technique for efficiently radiating heat from a display panel, suppressing cost increase.

According to the invention, a bonding member for bonding a display panel and a metallic chassis member together is a hot-melt adhesive having adhesion at ordinary temperature and filled with a heat conduction imparting agent, the thickness of the bonding member is 0.3 to 0.8 mm, and a plurality of the bonding members are arranged discretely in a predetermined direction.

With this structure, it is possible to reduce the amount of usage of the hot-melt adhesive as the heat conductive member. Since the hot-melt adhesive is used as the heat conductive member, it is possible to bond the flat display panel and the chassis member together within a short time and thereby reduce costs.

Further, according to the invention, the display panel and the metallic chassis members are bonded together through heat conductive bonding members, and the chassis member is provided with a through hole through which air is circulated in a space formed by the bonding members, the back of the display panel, and the chassis member.

The bonding members may be the hot-melt adhesives, and may be shaped like reeds for example. Further, the through hole may be formed extending in a direction perpendicular to a longitudinal direction of the bonding members.

Further, a rear cover disposed so as to cover the back of the chassis member may be provided with an air circulation hole, and air may be taken into and exhausted from the space through the air circulation hole and the through hole of the chassis member. Furthermore, a light-tight member may be applied over substantially the entire back surface of the display panel.

According to the invention, it is possible to provide a flat-panel display apparatus having excellent cost performance and p and efficiently radiate heat from the display panel at low cost.

BRIEF DESCRIPTION OF THE DRAWINGS

FIG. 2 is an illustration showing a state in which a heat conductive member is applied in stripe shapes to the back of a PDP according to the first embodiment;

DETAILED DESCRIPTION OF THE EMBODIMENTS

Figure 1:
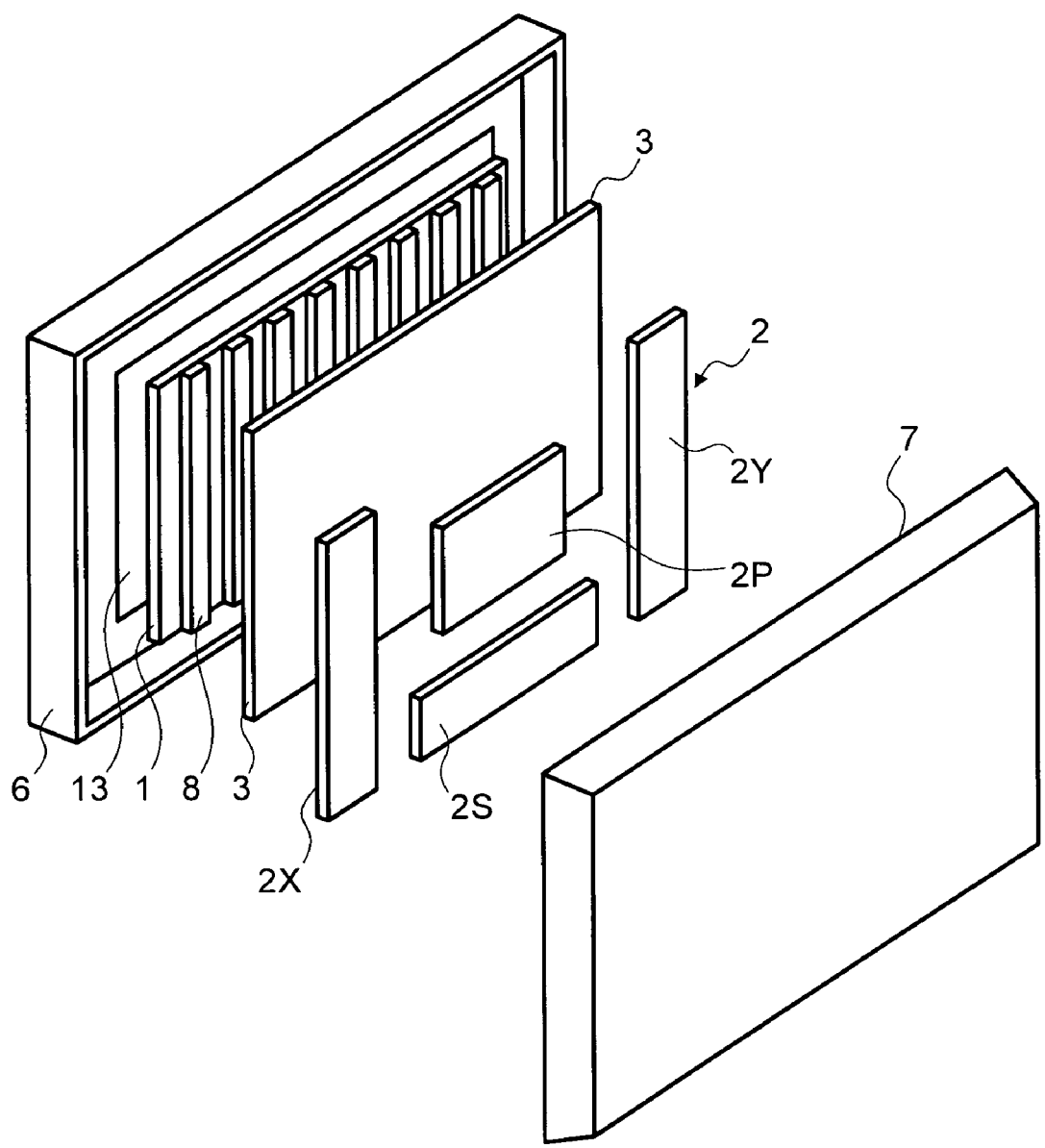
FIG. 1 is an exploded perspective view showing the principal part of a plasma display apparatus according to a first embodiment of the present invention.

Hereinafter, embodiments of the present invention will be described in detail with reference to the accompanying drawings. Although the following description is directed to a display apparatus equipped with a PDP as a flat display panel, the invention is not limited thereto. The invention is also applicable to a display apparatus equipped with such a display panel as a field emission display panel, an organic electroluminescence panel, an LED display panel structured by arranging LEDs in two-dimensional form. Throughout the drawings, components having the same functions are denoted by the same reference numerals and will not be described repeatedly.

According to the invention, a hot-melt adhesive (hereinafter abbreviated as an "HM adhesive") having adhesion at ordinary temperatures (about 15° C. to 25° C., especially 25° C. which is room temperature) is used as a heat conductive bonding member (hereinafter referred to as a heat conductive member) for bonding a display panel and a metallic chassis member together. A solid thermoplastic resin or thermoplastic rubber as the HM adhesive is heated to a high temperature to be melted and applied to an adherend. Since the adhesion of the HM adhesive is maintained even after cooled to room temperature, the HM adhesive can be used for crimping and fixing in the same way as so-called double-sided tapes. Since bonding can be carried out within a short time (e.g., several seconds) without a solvent, it is possible to reduce coating-bonding process time and cost.

First Embodiment

FIG. 1 is an exploded perspective view showing the principal part of a plasma display apparatus according to a first embodiment of the invention.

In FIG. 1, an enclosure housing a PDP 1 is constructed of a front frame 6 with a front cover 13 made of e.g. glass placed over the opening and a metallic rear cover 7. The PDP 1 is held by bonding it to the front surface of a chassis member 3 made of, e.g., aluminum through a heat conductive member 8, and a plurality of circuit boards 2 for display-driving the PDP 1 are mounted on the back of the chassis member 3. The heat conductive member 8 is provided to efficiently conduct heat generated at the PDP 1 to the chassis member 3 for heat radiation. The chassis member 3 radiates heat generated from the PDP 1 to cool the PDP 1 as well as having the function of holding the PDP 1. The circuit boards 2 include a X sustain board 2X and a Y sustain board 2Y for display-driving and controlling the PDP 1, a power supply board 2P, and a signal processing board 2S which are electrically connected, through a plurality of flexible wiring boards (not shown) extending over the four edges of the chassis member 3, to electrode extraction portions (not shown) extracted to edges of the PDP 1.

Since the plasma display apparatus is constructed as described above, heat generated at the PDP 1 is efficiently conducted to the chassis member 3 through the heat conductive member 8. The chassis member 3 radiates the heat inside the apparatus, and the radiated heat is exhausted outside the enclosure using, e.g., a fan (not shown). Thus, the PDP 1 is efficiently cooled.

In this embodiment, an HM adhesive having adhesion at room temperature is used as the heat conductive member 8, and is heated to a fluid state of low viscosity (hereinafter referred to as a "molten state") to be applied to an adherend (the PDP 1 in this embodiment). The melt heating temperature is 120 to 180° C. If it exceeds 180° C., the heat resistance of the resin composition of a base undesirably deteriorates inside a hot dispenser (not shown). If it falls below 120° C., the viscosity increases and the fluidity deteriorates. The composition of the heat conductive member 8 will be described later.

FIG. 2 is an illustration showing a state in which the heat conductive member is applied to the back of the PDP according to the first embodiment in the form of stripes. The upper figure in FIG. 2 is a front view of the heat conductive member applied to the back of the PDP as viewed from the heat conductive member side, and the lower figure is a top view thereof.

In FIG. 2, the heat conducting sections of the heat conductive member 8 are applied in the form of stripe-shaped rectangles (hereinafter referred to as reed shapes) of a predetermined width WD parallel to the short side of the PDP (the vertical direction of the screen) with a predetermined space W therebetween along the long side of the PDP (in the horizontal direction of the screen) Each reed shape applied discretely is referred to as a heat conducting section 80.

In the case where the heat conducting sections of the heat conductive member 8 are arranged with the predetermined space W therebetween as shown in FIG. 2 instead of being disposed over the entire surface of the PDP, the temperature distribution of the PDP becomes non uniform so that brightness unevenness may occur. For this reason, the applicant has measured brightness unevenness when displaying all white, in combinations of values that are 1, 3, 5, 10, and 20 (mm) for the coating space W and 0.5 and 1.0 (mm) for the thickness t of the heat conductive member that has bonded the PDP 1 and the chassis member 3. Further, the width WD of a reed shape is 10 mm and the thickness of the front glass panel and the back glass panel of the PDP is 3 mm. Table 1 shows the result thereof.

TABLE 1

|  |  | Space | | | | |
|---|---|---|---|---|---|---|
|  |  | 1 | 3 | 5 | 10 | 20 |
| Thickness | 0.5 | A | A | A | A | B |
|  | 1.0 | A | A | A | B | C |

In Table 1, symbol A denotes that the brightness unevenness is within 1%, symbol B denotes that the brightness unevenness is within 3%, symbol C denotes that the brightness unevenness is over 3%, and the space and the thickness are in mm. An empirical limitation within which brightness unevenness can be observed is about 2%, and it is considered that there is no practical problem under this value.

As is apparent from Table 1, in the case where the thickness is 1.0 mm, brightness unevenness is not observed with a space of 5 mm or less, and in the case where the thickness is 0.5 mm, brightness unevenness is not observed with a space of 10 mm or less. In other words, the coating space can be increased as the thickness of the heat conductive member is decreased. For example, as shown in Table 1, if the thickness is changed to 0.5 mm from 1 mm, the coating space W can be doubled to 10 mm from 5 mm. That is, if the thickness is 0.5 mm, the coating space is approximately equal to the coating width; therefore, the amount of usage of the heat conductive member can be reduced in half compared to the arrangement all over the surface, which leads to cost reduction. As a matter of course, even if the thickness is 1 mm, the amount of usage can be reduced, which leads to cost reduction.

Further, heat cycle tests (cycled between room temperature and 100° C.) have been carried out to check whether bond separation occurs, and it has been confirmed that there is no bond separation under either condition.

Next, the composition of the HM adhesive used as the heat conductive member 8 will be described. Among a wide variety of HM adhesives, are presentative one will be described. However, the invention is not limited thereto.

In this embodiment, there is used a base (SEPS) obtained by hydrogenating styrene-isoprene-styrene rubber (SIS) of a rubber elasticity component. In this embodiment, 30 wt % of copolymerization rubber (SIS) and 40 wt % of completely hydrogenated resin are used. Further, 10 wt % of rosin ester and 10 wt % of terpene resin are used as a tackifier. Furthermore, 10 wt % of thermal-degradation inhibitor and oil softener for imparting fluidity are used. The HM adhesive of such a composition is employed as a basis. Hereinafter, this HM adhesive of the basis is referred to as an HM adhesive A for the sake of convenience.

Copolymerization rubber components also include styrene-butadiene-styrene (SBS) and styrene-ethylene-butadiene-styrene (SEBS) obtained by hydrogenating SBS. It is possible to use a variety of these materials in design. The molecular weight of the copolymerization rubber component is reflected on the melt viscosity and determined by creep resistance and the thermal design of an apparatus for coating an adherend.

The temperature-viscosity characteristics of the HM adhesive A of the above composition indicate 170,000 cps (170 Pa·s) at 120° C. and 60,000 cps (60 Pa·s) at 140° C. (values measured by a rotation viscosimeter).

Figure 3:
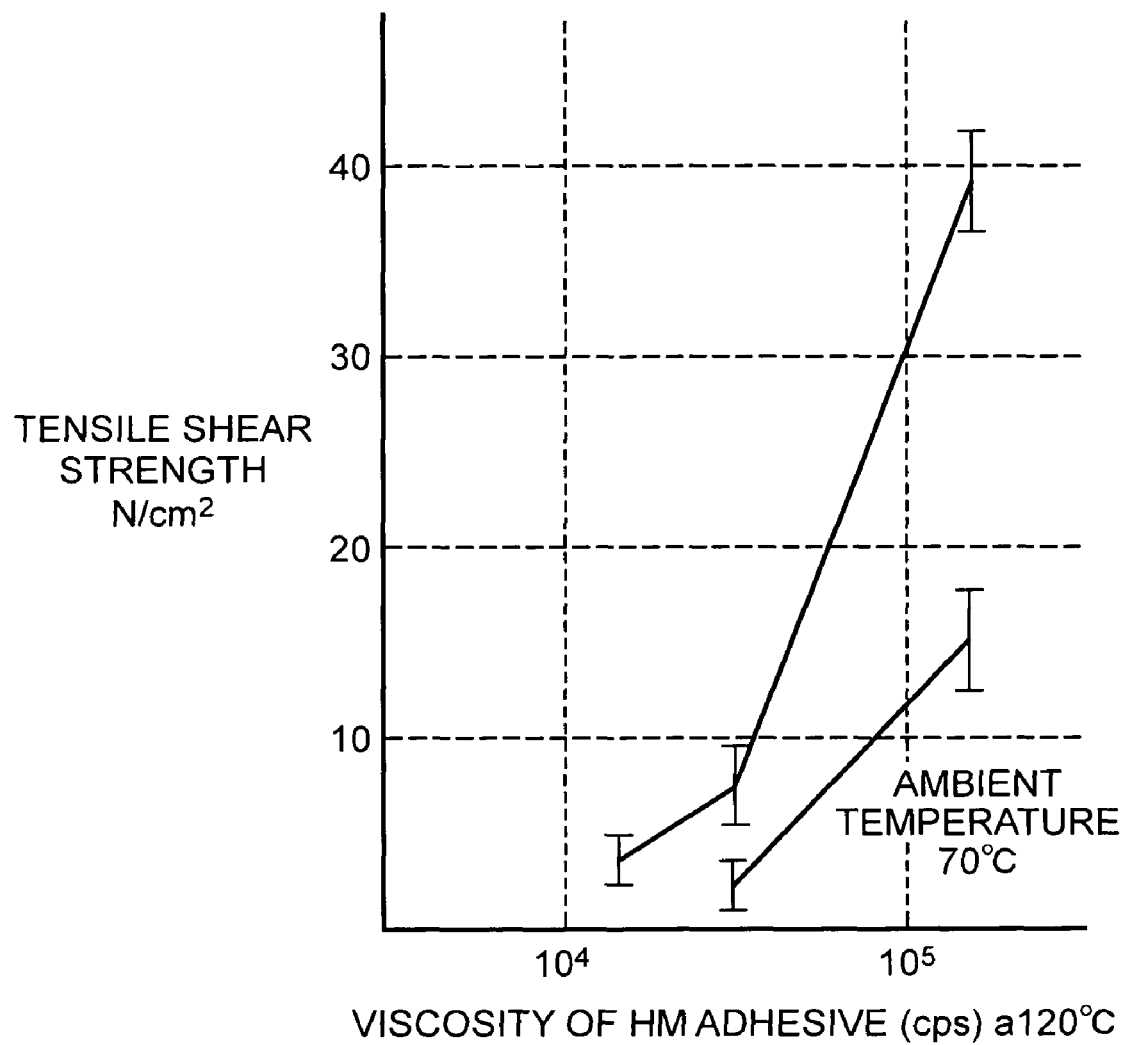
FIG. 3 is a graph showing the tensile shear strength with respect to the viscosity of an HM adhesive A.

FIG. 3 is a graph showing the tensile shear strength with respect to the viscosity of the HM adhesive A. FIG. 3 illustrates the tensile shear strength in the case of a bond thickness of 40 μm, with aluminum and aluminum as adherends. In the plasma display apparatus, the temperature of the back of the PDP is about 60° C. or less when in use in an environment of room temperature (25° C.) . Accordingly, at an ambient temperature of 70° C., the tensile shear strength is about 15 N/cm$^2$(1.5 kg/cm$^2$) with respect to a viscosity of 170,000 cps (170 Pa·s) at 120° C., as is apparent from FIG. 3. A 42-inch PDP has a weight of about 8 kg. In the case where the coating shape of the HM adhesive is the reed shape as shown in FIG. 2, the bonding area is about half the back surface area (about 5,000 cm$^2$) of the PDP. In spite thereof, it is possible to withstand about 3.8 tons of weight.

Consequently, even in the case of using the HM adhesive described in this embodiment, it is possible to hold and bond the 42-inch PDP weighting about 8 kg with sufficient strength. The tensile shear strength decreases as the bond thickness (i.e., the thickness of the heat conductive member) is increased. In the case where the bond thickness is about 1 mm, the tensile shear strength reduces to about one-tenth of that in a bond thickness of 40 μm. Despite this, it is possible to hold and bond a load of about 380 kg. Consequently, even if the bond thickness is about 1 mm, it is possible to hold and bond the 42-inch PDP by a margin of a little less than 50 times (380/8=48).

In order to impart heat conductivity to the HM adhesive A, it is possible to add, e.g., aluminum nitride (as a heat conduction imparting agent) of about 100 g to the HM adhesive A of 1 kg (hereinafter the HM adhesive filled with a heat conduction imparting agent is referred to as an "HM adhesive AL")

. In this case, the HM adhesive AL has a heat conductivity of about 0.4 W/mK, and a breaking elongation of about 200% at room temperature. Adding aluminum nitride of about 300 g increases the heat conductivity to about 1 W/mK. Further, combining 50 wt % of magnesium oxide or carbon graphite also brings about 1 W/mK.

The breaking elongation $\epsilon$, of the heat conductive member 8, capable of absorbing the difference in thermal expansion coefficient between glass forming the back of the PDP and e.g. aluminum as the material of the chassis member is expressed by the following equation (1).

$$\epsilon \geq (1/2) \times L \times (\lambda_2 - \lambda_1) \times \Delta T/t \quad (1)$$

where L is the length of the heat conductive member, $\lambda_2$ is the thermal expansion coefficient of aluminum-which is the material of the chassis member, $\lambda_1$ is the thermal expansion coefficient of glass, $\Delta T$ is a temperature rise value, and t is the thickness of the heat conductive member. Further, the thickness t of the heat conductive member is expressed by the following equation (2) obtained by modifying the equation (1).

$$t \geq (1/2) \times L \times (\lambda_2 - \lambda_1) \times \Delta T/\xi \quad (2)$$

For example, in the case where 42-inch PDP is bonded to the chassis member, the thickness of the heat conductive member is obtained as follows. For example, in the case where L is the long side of the PDP (the length in the horizontal direction of the screen) which is 90 cm, the thermal expansion coefficient $\lambda_1$ of glass is $8.3 \times 10^{-6}$/° C., the thermal expansion coefficient $\lambda_2$ of the chassis member made of aluminum is $22 \times 10^{-6}$/°C., the temperature rise value $\Delta T$ is 75° C. (assume that the temperature of the glass panel rises from ordinary temperature up to 95° C. at the maximum), assuming that the breaking elongation $\xi$ is 50% for example, the thickness t of the heat conductive member is equal to 0.86 mm, calculated from the equation (2). However, if the breaking elongation is 100% for example, t=0.43 obtained from the equation (2). That is, even if the thickness t of the heat conductive member is 0.43 mm, it is possible to absorb the difference in thermal expansion coefficient between the PDP (glass) and the chassis member (aluminum).

Thus, if the breaking elongation $\xi$ of the heat conductive member is 100% or more, it is possible to reduce the thickness of the heat conductive member to 1 mm or less. That is, if the breaking elongation $\xi$ is 100% or more, the coating thickness t of the HM adhesive AL can be 0.5 mm or less; therefore, the amount of usage of the HM adhesive can be reduced, which leads to cost reduction. Further, even in the case of a heat conductivity of about 0.4 W/mK, if the coating thickness is small, heat from the PDP can be efficiently conducted to the chassis member, thus making it possible to reduce the stress strain of the PDP. Further, since the coating thickness can be reduced, for example, from 1 mm to 0.5 mm or less, the heat conductivity of the HM adhesive AL, that is, the amount of the heat conduction imparting agent contained in the HM adhesive AL can be reduced without reducing comprehensive heat conduction. The viscosity of the HM adhesive AL decreases as the amount of the heat conduction imparting agent decreases, thus making it possible to improve the fluidity and coating properties. Improved coating properties can reduce coating process time and cost.

Since the breaking elongation of the HM adhesive AL of this embodiment is about 200%, the minimum coating thickness of the HM adhesive AL is 0.22 mm calculated from the equation (2). However, the coating thickness of the HM adhesive AL is preferably 0.3 mm or more because too small a coating thickness makes coating difficult. Further, the maximum coating thickness of the HM adhesive AL is preferably 0.8 mm or less, in consideration of deterioration in coating properties due to the increase of the coating thickness t.

The temperature-viscosity characteristics shift to the high-viscosity side due to the addition of the heat conduction imparting agent. Therefore, when a hot dispenser for example is used to apply the HM adhesive AL, the discharge air pressure needs to be raised, assuming that the discharge air pressure is 0.5 MPa (5 kg/cm$^2$) or less as a common air pressure.

Figure 4:
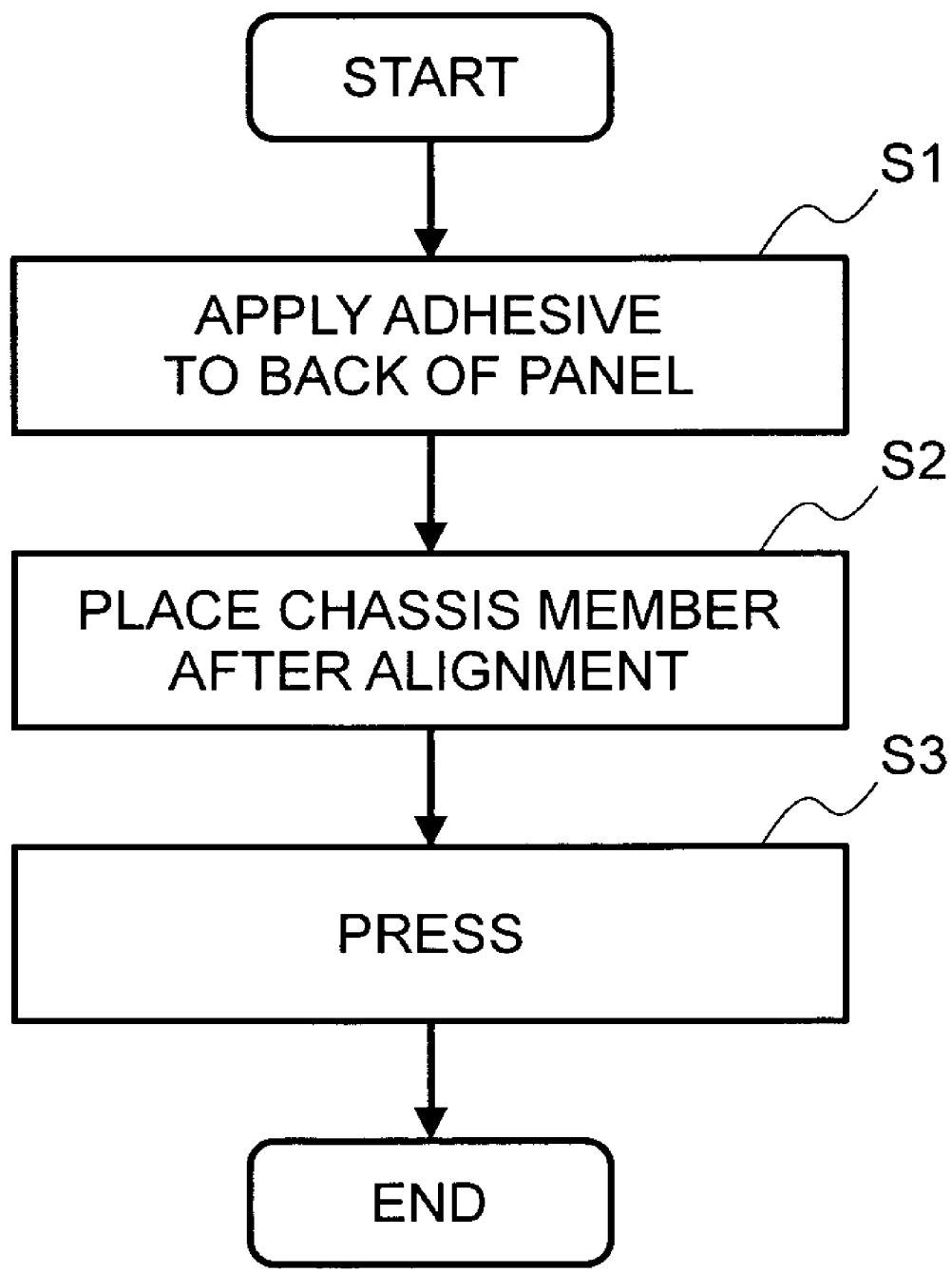
FIG. 4 is a flowchart showing a bonding process.

Next, a bonding process for bonding the PDP and the chassis member together according to the first embodiment will be described. FIG. 4 is a flowchart showing the bonding process. First, in step 1 of FIG. 4 (hereinafter step is abbreviated as "S"), the heat conducting sections of the HM adhesive AL are applied to the back of the PDP in reed shapes with a predetermined space therebetween as shown in FIG. 2, using a hot dispenser. The hot dispenser (not shown) has a plurality of nozzles and performs coating at a predetermined moving speed, with the nozzles spaced about 2 mm from the back of the PDP. In this embodiment, the width of a reed shape is 10 mm, the coating space is 10 mm, and the coating thickness is 0.5 mm. The use of a plurality of nozzles (not shown) makes it possible to perform coating at a time, thus reducing process time and cost. Next, the chassis member is placed on the PDP coated with the HM adhesive AL while alignment (position adjustment) is being performed (S2). Further, the chassis member is heated preferably to temperatures of 60 to 80° C. on the press surface and pressed for a predetermined time period for pressure bonding (S3). Then, the bonding process ends. Since the HM adhesive reaches a rubbery state within a short time (e.g., several seconds), it is possible to reduce coating-bonding process time and cost. In FIG. 4, the PDP coated with the HM adhesive is bonded to the chassis member, but the invention is not limited thereto. The chassis member coated with the HM adhesive may be bonded to the PDP.

As has been described, according to this embodiment, the use of the HM adhesive can reduce coating-bonding process time and cost. Further, arranging the reed shapes as the coating shape with a predetermined space therebetween can reduce the amount of usage of the HM adhesive, and decreasing the coating thickness to below 0.5 mm can further reduce the amount of usage, which leads to cost reduction. Further, since the coating thickness is decreased to below 0.5 mm, it is possible to improve the heat conductivity and reduce the stress strain of the PDP. Furthermore, when the filling factor of the heat conduction imparting agent is decreased without changing the heat conduction, the viscosity is decreased, the fluidity is improved, and the coating properties are improved, thus also making it possible to reduce costs.

Figure 5:
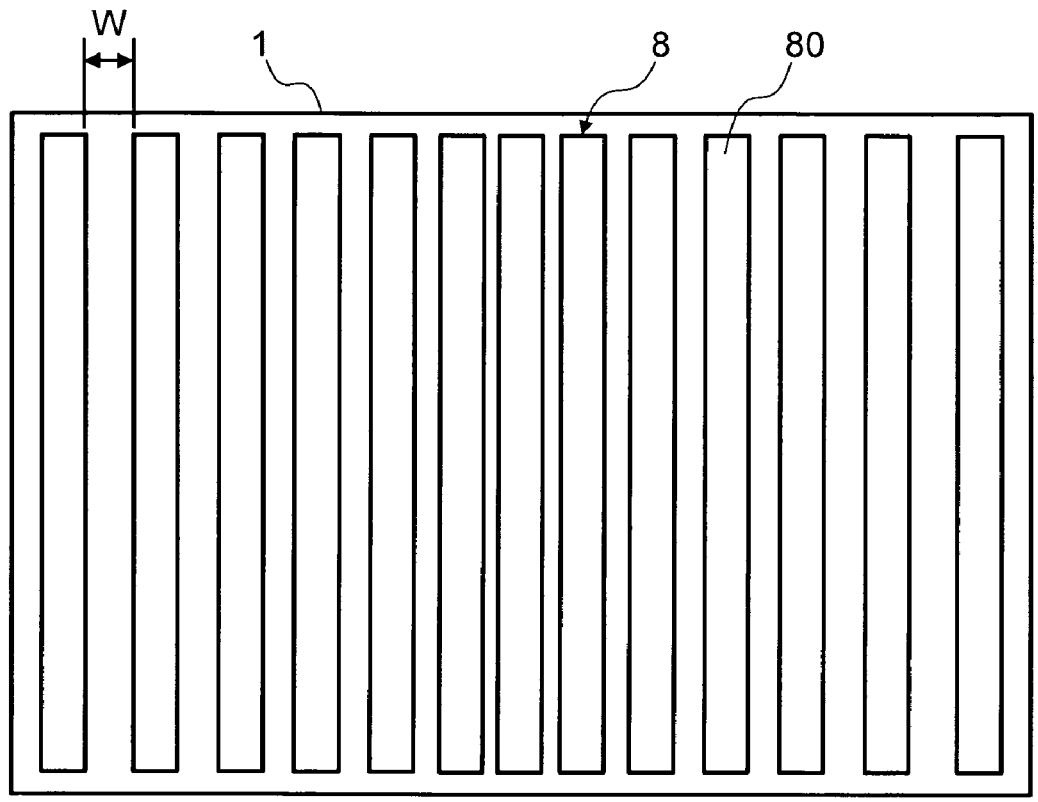
FIG. 5 is an illustration of a heat conductive member applied to the back of a PDP according to a modification of the first embodiment of the invention as viewed from the heat conductive member side.

In the above description, the heat conducting sections of the HM adhesive AL are applied in reed shapes with a predetermined space therebetween, the invention is not limited thereto. Since a person usually look at the center of the screen when viewing the screen, consideration needs to be given to preventing brightness unevenness form occurring at the center f the screen. For this reason, as shown in FIG. 5, the space W between adjacent heat conducting sections 80 is decreased toward the center of the screen so that the temperature distribution of the PDP 1 becomes uniform, and the space W is increased toward the sides of the screen laterally away from the center of the screen. As a matter of course, the temperature distribution of the PDP 1 is not uniform at the sides of the screen; however, it is needless to say that the space W is selected such that brightness unevenness is difficult to detect (e.g., in the case of a coating thickness of 0.5 mm, W=10 mm or less).

The foregoing description has been made on the cost reduction obtained by decreasing the coating thickness of the HM adhesive. However, there are other potential effects. Next, description will be made of another effect, that is, an unwanted radiation reduction effect obtained by decreasing the coating thickness.

Figure 6:
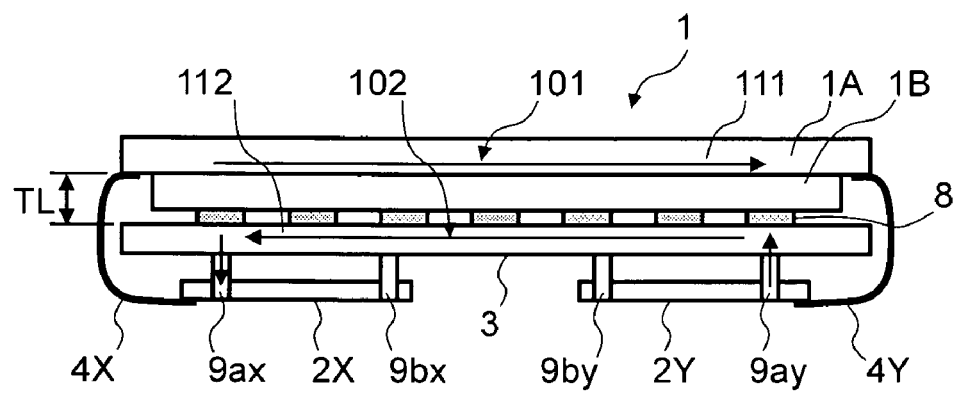
FIG. 6 is a horizontal sectional view of the principal part of a plasma display apparatus according to the first embodiment.

FIG. 6 is a horizontal sectional view of the principal part of the plasma display apparatus according to this embodiment. In FIG. 6, the PDP 1 is constructed of a front glass substrate 1A of e.g. 3 mm in thickness on which pairs of X and Y sustain electrodes (not shown) are formed, a back glass substrate 1B of e.g. 3 mm in thickness on which address electrodes (not shown) arranged at right angles to the X and Y sustain electrodes are formed, and discharge spaces therebetween (not shown) having a height of about 100 µm. The circuit boards 2 for driving the PDP 1 are mounted on the back of the chassis member 3 (e.g. 1.5 mm thick) through the use of bosses 9. Although the circuit boards 2 include the X and Y sustain boards, the power supply board, and the signal processing board, only the X sustain board 2X and the Y sustain board 2Y are illustrated in FIG. 6. The X sustain board 2X is electrically connected to the front glass substrate 1A of the PDP 1 through a flexible wiring board 4X, and the Y sustain board 2Y is electrically connected to the front glass substrate 1A of the PDP 1 through a flexible wiring board 4Y. The grounds (not shown) of the X sustain board 2X and the Y sustain board 2Y are connected to the chassis through conductive bosses 9ax and 9ay, respectively. Bosses 9bx and 9by are not connected to the grounds nor circuits (not shown) of the X sustain board 2X and the Y sustain board 2Y.

For example, when the X sustain board 2X drives the PDP 1 during a sustain discharge period, a sustain discharge current passes through the X sustain board 2X, the flexible wiring board 4X, the PDP 1, the flexible wiring board 4Y, the Y sustain board 2Y, the boss 9ay, the chassis member 3, the boss 9ax, and the X sustain board 2X in a loop. At this time, a current 101 flows through the PDP 1 in the direction of an arrow 111, and a current 102 flows through the chassis member 3 in the direction of an arrow 112 opposite to the arrow 111. That is, the current 101 flowing through the PDP 1 is opposite in direction to the current 102 flowing through the chassis member 3. Thus, electromagnetic radiation caused by the current 101 flowing through the PDP 1 and electromagnetic radiation caused by the current 102 flowing through the chassis member 3 cancel each other out, thereby reducing unwanted electromagnetic radiation from the plasma display apparatus. The unwanted radiation decreases as the area formed by the current loop, that is, the distance in the thickness direction between the PDP 1 and the chassis member 3 decreases.

Calculation will be made on the distance TL in the thickness direction from the X and Y sustain electrodes (not shown) of the PDP 1 to the chassis member 3. In the case where the heat conductive member 8 is 1 mm, the distance TL is approximately equal to the sum of the thickness of the back glass substrate (3 mm) and the thickness of the heat conductive member 8 (1 mm), which is 4 mm. In the case where the heat conductive member 8 is 0.5 mm, the distance TL is about 3.5 mm. That is, the thinner the heat conductive member 8, the less the unwanted radiation from the plasma display apparatus becomes.

Further, if conductive metallic particles, for example, copper particles are added as the heat conduction imparting agent for the heat conductive member 8, the heat conductive member 8 itself becomes conductive, thus making it possible to further reduce the unwanted radiation from the plasma display apparatus.

Second Embodiment

In the first embodiment, the heat conducting sections of the heat conductive member (HM adhesive) are applied in reed shapes of a predetermined width with a predetermined space therebetween along the long side of the PDP (in the horizontal direction of the screen). However, the invention is not limited thereto.

Figure 7:
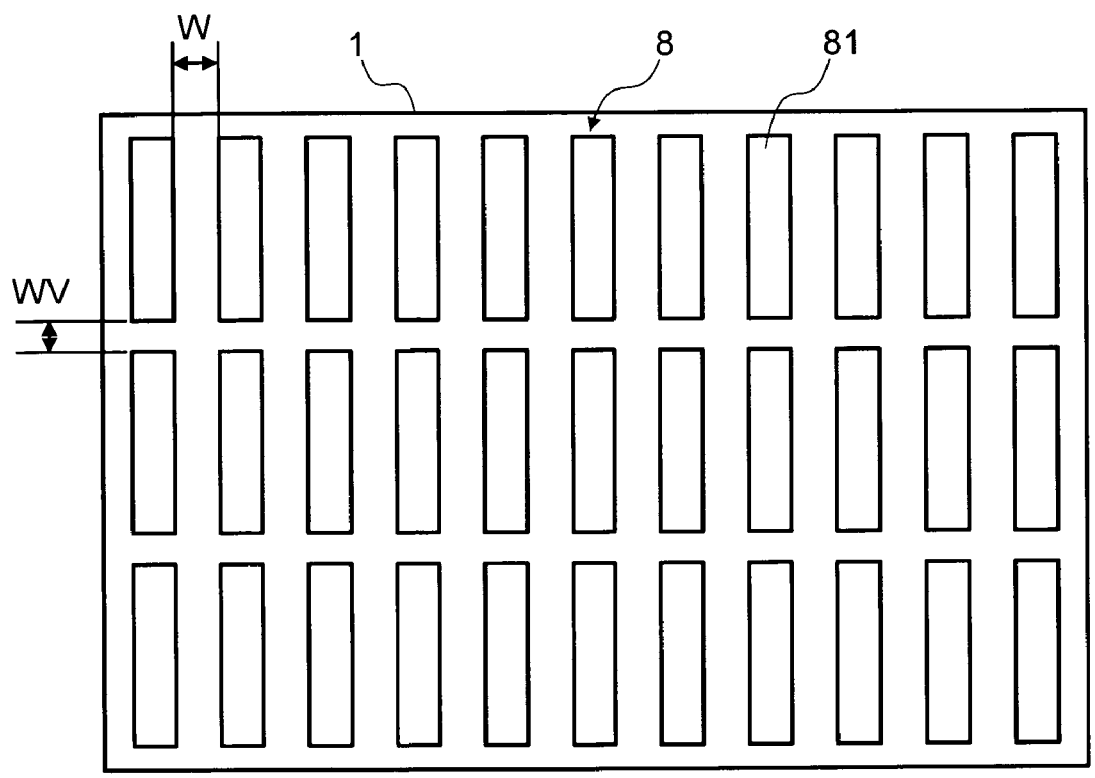
FIG. 7 is an illustration of a heat conductive member applied to the back of a PDP according to a second embodiment of the invention as viewed from the heat conductive member side.

FIG. 7 is an illustration of a heat conductive member applied to the back of the PDP according to a second embodiment as viewed from the heat conductive member side.

In FIG. 7, the heat conducting sections of the heat conductive member 8 are applied in the form of stripe-shaped rectangles (hereinafter referred to as reed shapes) parallel to the short side of the PDP (the vertical direction of the screen) with a predetermined space W therebetween along the long side of the PDP (in the horizontal direction of the screen). However, in this embodiment, unlike the first embodiment, the heat conducting sections of the heat conductive member 8 are applied discretely with a predetermined space WV therebetween (e.g., WV=10 mm or less in the case of a coating thickness of 0.5 mm) that do not cause brightness unevenness, in the short-side direction (the vertical direction of the screen) as well. Each reed shape applied discretely is referred to as a heat conducting section 81.

According to this embodiment, since heat conducting sections 81 are applied with a predetermined space therebetween in the short-side direction as well as in the long-side direction, the amount of usage of the heat conductive member can be further reduced, which leads to cost reduction.

Third Embodiment

Figure 8:
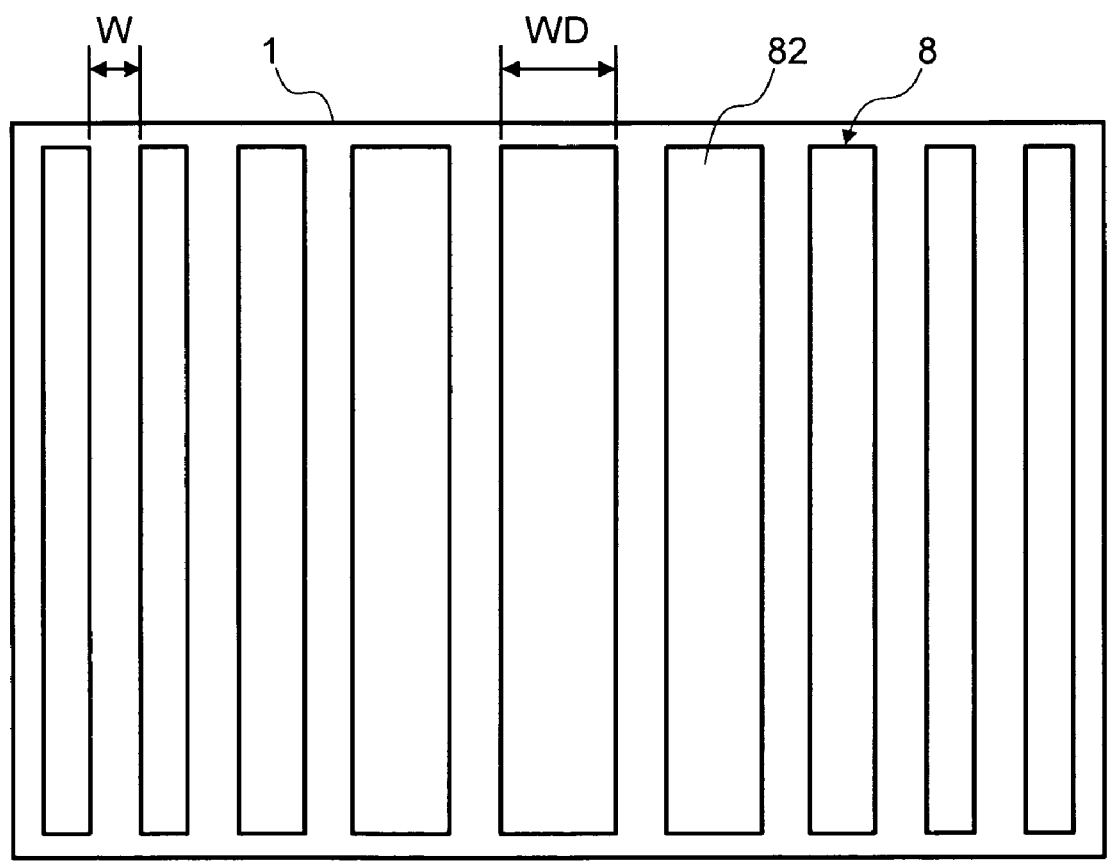
FIG. 8 is an illustration of a heat conductive member applied to the back of a PDP according to a third embodiment as viewed from the heat conductive member side.

Next, a third embodiment of the invention will be described. FIG. 8 is an illustration of a heat conductive member applied to the back of the PDP according to the third embodiment as viewed from the heat conductive member side.

In the first embodiment, the heat conducting sections of the heat conductive member (HM adhesive) are applied in reed shapes of a predetermined width with a predetermined space therebetween along the long side of the PDP (in the horizontal direction of the screen). However, in this embodiment, as shown in FIG. 8, the width WD of reed-shaped heat conducting sections 82 is increased toward the center of the screen, and decreased toward the sides of the screen.

As has been described, since a person usually look at the center of the screen when viewing the screen, consideration needs to be given to preventing brightness unevenness form occurring at the center f the screen. For this reason, the width WD of reed-shaped heat conducting sections 82 is increased toward the center of the screen so that the temperature distribution of the PDP 1 becomes uniform, and the width WD is decreased toward the sides of the screen laterally away from the center of the screen. As a matter of course, the temperature distribution of the PDP 1 is not uniform at the sides of the screen; however, it is needless to say that the width WD is selected such that brightness unevenness is difficult to detect (e.g., in the case of a coating thickness of 0.5 mm and a space W of 10 mm, WD=10 mm or more).

According to this embodiment as well, though the effect of reducing the amount of usage of the heat conductive member is less than that of the first embodiment, decreasing the coating thickness (e.g., 0.5 mm) can reduce the amount of usage of the heat conductive member, which leads to cost reduction.

In addition, the combination (not shown) of this embodiment and the embodiment of FIG. 5 can be employed.

That is, the width WD of heat conducting sections is increased and the space W is decreased toward the center of the screen so that the temperature distribution of the PDP becomes uniform for less unevenness of brightness. Further, the width WD is decreased and the space W is increased toward the sides of the screen. As a matter of course, it is needless to say that the width WD and the space W are selected such that brightness unevenness is difficult to detect at the sides of the screen. Further, it is needless to say that any combination of the first to third embodiments can be implemented.

Fourth Embodiment

Hereinafter, a fourth embodiment of the invention will be described. The following description is directed to a display apparatus equipped with a PDP as a flat display panel.

Figure 9:
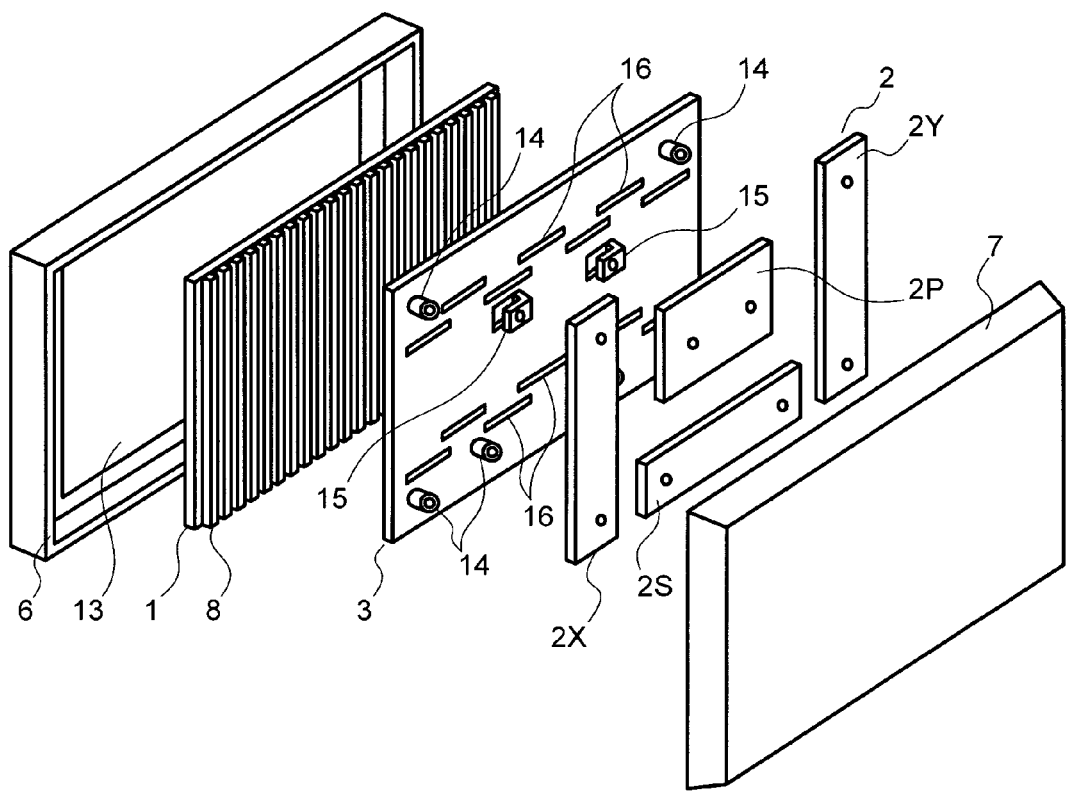
FIG. 9 is an exploded perspective view showing the principal part of a plasma display apparatus according to a fourth embodiment of the invention.

FIG. 9 is an exploded perspective view showing the principal part of a plasma display apparatus according to the fourth embodiment of the invention. In FIG. 9, an enclosure housing a PDP 1 is constructed of a front frame 6 with a front cover 13 made of e.g. glass placed over the opening and a metallic rear cover 7. The PDP 1 is held by bonding it to the front surface of a chassis member 3 made of, e.g., aluminum through a heat conductive member 8, and a plurality of circuit boards 2 for display-driving the PDP 1 are mounted on the back of the chassis member 3. A light-tight member (not shown) is applied in the form of a thin film over substantially the entire back surface of the PDP 1. The heat conductive member 8 is provided to efficiently conduct heat generated at the PDP 1 to the chassis member 3 for heat radiation, and disposed in the form of stripes substantially parallel to the short side of the PDP 1 as shown in FIG. 9. The chassis member 3 radiates heat generated from the PDP 1 to cool the PDP 1 as well as having the function of holding the PDP 1. Further, the chassis member 3 is provided with a plurality of slit-shaped through holes 16 as shown in FIG. 9. The function of the slit-shaped through holes 16 will be described in detail later. The circuit boards 2 include a X sustain board 2X and a Y sustain board 2Y for display-driving and controlling the PDP 1, a power supply board 2P, and a signal processing board 2S. These circuit boards are secured to bosses 14 and protrusions 15 provided on the chassis member 3 by mounting screws (not shown) or the like. The circuit boards 2 are electrically connected, through a plurality of flexible wiring boards (not shown) extending over the four edges of the chassis member 3, to electrode extraction portions (not shown) extracted to edges of the PDP 1. In this embodiment, the HM adhesive described in the first embodiment etc. is used as the heat conductive member 8.

Since the plasma display apparatus according to this embodiment is constructed as described above, heat generated at the PDP 1 is efficiently conducted to the chassis member 3 through the heat conductive member 8. The chassis member 3 radiates the heat inside the apparatus, and the radiated heat is exhausted outside the enclosure using, e.g., a fan (not shown) Thus, the PDP 1 is efficiently cooled.

Figure 10:
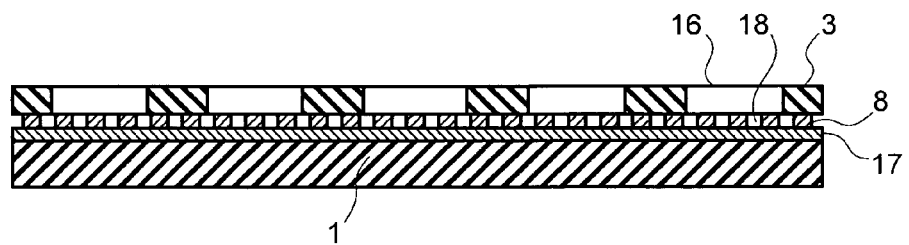
FIG. 10 is a sectional view of a bonded state of a PDP to a chassis member as viewed from the top according to the fourth embodiment.

FIG. 10 is a sectional view of a bonded state of the PDP 1 to the chassis member 3 as viewed from the top according to the fourth embodiment. In FIG. 10, a light-tight member 17 is applied over substantially the entire back surface of the PDP 1. Further, the chassis member 3 is provided with a plurality of slit-shaped through holes 16 as described above.

In FIG. 10, the heat conducting sections of the heat conductive member 8 are arranged in the form of stripes of a predetermined width WD parallel to the short side of the PDP (the vertical direction of the screen) . Hereinafter, the stripe shapes of the heat conducting sections of the heat conductive member 8 are referred to as reed shapes. Further, the heat conducting sections of the heat conductive member 8 are arranged with a predetermined space W therebetween along the long side of the PDP (in the horizontal direction of the screen). That is, the heat conducting sections of the heat conductive member 8 are arranged discretely along the long side of the PDP.

Detail description will be made on the light-tight member 17. The light-tight member 17 is constructed of a three-dimensional cross-linking material such as a reaction-type hot-melt adhesive (hereinafter referred to as an R-HM adhesive) or room temperature curing silicon rubber (e.g., one-component RTV silicon rubber: KE-3467 manufactured by Shin-Etsu Silicones) . The R-HM adhesive is described in detail, for example, in Japanese Unexamined Patent Publication No. Hei 8-259923, for reference. Three-dimensional cross-linking materials also include a photo-curing material and an epoxy curing material. However, due to the cost increases of these materials and curing apparatuses, it is preferable to use the R-HM adhesive or the room temperature curing silicon rubber. The three-dimensional cross-linker is adopted in this embodiment because it has little high-temperature fluidity (though it softens a little) after cured. That is, the use of the three-dimensional cross-linker as the light-tight member 17 can reduce creep deformation caused by heat generated at the PDP 1. Compounding agent such alumina, talc, magnesium hydroxide, or carbon black is added to the material, thereby adjusting light-tight characteristics and heat conductivity characteristics thereof. In this embodiment, the transmittance of the light-tight member 17 is preferably 20% or less.

Now, description will be made on the coating method of the R-HM adhesive used as the light-tight member 17. First, the R-HM adhesive is dissolved at about 120° C. in a melting basin (not shown), and then fed to a hot spray gun, using a liquid feed pump. Then, the R-HM adhesive together with air is sprayed on the PDP 1, with a plurality of nozzles for jetting air arranged around the injection nozzle of the hot spray gun. The sprayed R-HM adhesive is cured in about several seconds (hot spraying).

In this embodiment, the thickness of the R-HM adhesive is 10 to 40 μm, preferably about 30 μm. In the case where 10 wt % of carbon black is combined with the R-HM adhesive, the light transmittance is 10% or less at a thickness of about 30 μm, thus obtaining desirable light-tight characteristics. The thickness of the R-HM adhesive can be more than the above thickness as long as desirable light-tight characteristics are obtained; however, the thickness of the R-HM adhesive is preferably not more than the above thickness in terms of heat conduction and cost.

It is possible to perform spray coating with the one-component RTV silicon rubber in a similar (unheated) way though the curing time is disadvantageously as long as several minutes. However, since KE-3467 is white in color and has a heat conductivity of about 2 W/mK, the one-component RTV silicon rubber may be used instead of the R-HM adhesive.

Figure 11:
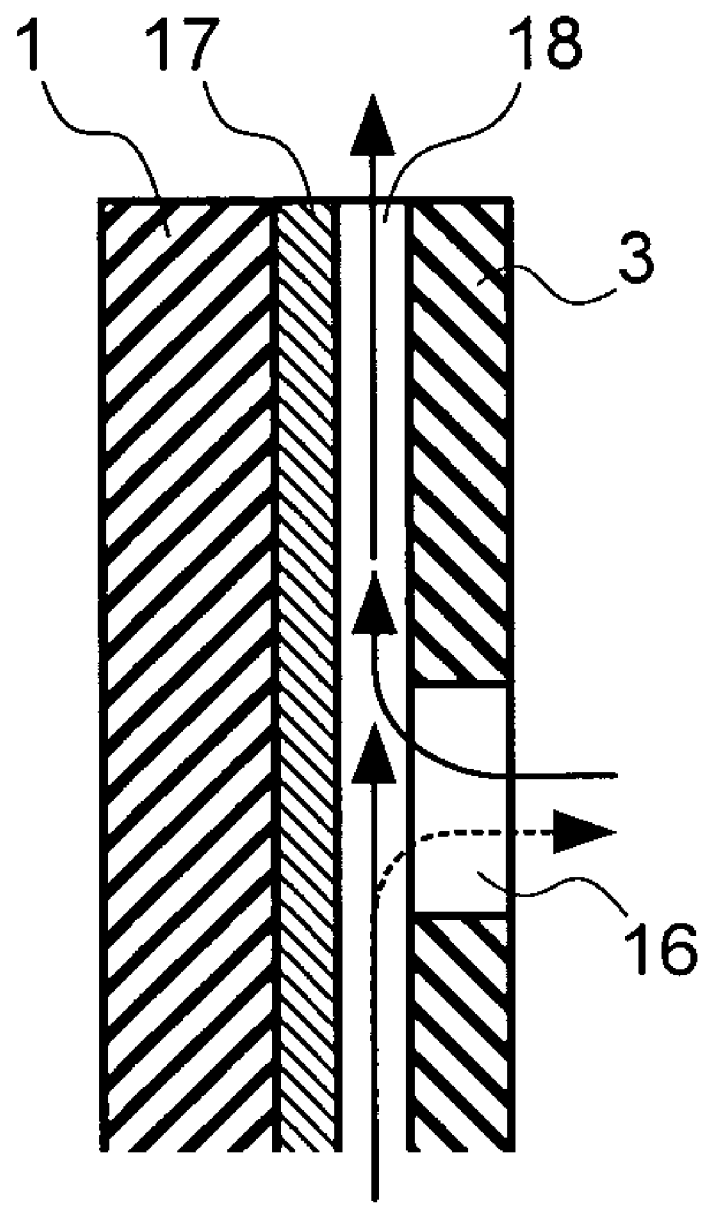
FIG. 11 is a sectional view of a slit-shaped through hole as viewed from the side.

Next, description will be made on the slit-shaped through holes 16 provided in the chassis member 3. FIG. 11 is a sectional view of a slit-shaped through hole as viewed from the side. As shown in FIG. 11, convection occurs in a space 18 formed by heat conducting sections of the heat conductive member 8 arranged in reed shapes, the back of the PDP 1, and the metallic chassis member 3, and the convection cools the PDP 1. In the case where there is no slit-shaped through hole 16, air taken from the bottom of the PDP 1 into the space 18 absorbs heat generated by the PDP 1 so that the temperature rises and convection occurs. Therefore, the higher the position in the space 18, the higher the air temperature and the less the heat-absorbing capacity becomes (the radiation performance decreases). In the case where there is provided a slit-shaped through hole 16, it is possible to exhaust part of the air in the space 18 through the slit-shaped through hole 16 and take outside air into the space 18, as shown in FIG. 11. That is, it is possible to circulate air between the back of the chassis member 3 and the space 18 through the slit-shaped through hole 16 provided in the chassis member 3. Since the air temperature in the space 18 has risen as described above so that air temperature taken in through the slit-shaped through hole 16 is lower than that in the space 18, it is possible to decrease the air temperature in the space 18 above the slit-shaped through hole 16. Accordingly, the lower the air temperature, the more heat from the PDP 1 can be absorbed. As a result, it becomes possible to further decrease the temperature of the PDP 1. Further, in the heat conductive member 8 conducting the heat of the PDP 1 to the chassis member 3, the surface facing the space 18 is cooled by the air in the space 18. Accordingly, the portions of the PDP 1 touching the heat conductive member 8 can be cooled.

As shown in FIG. 9 for example, the slit-shaped through holes 16 are formed parallel to the horizontal direction of the PDP land in rectangular shapes. That is, the longitudinal direction of the slit-shaped through holes 16 is perpendicular to the longitudinal direction of the heat conductive member 8 shaped like rectangles. Thus, air in a plurality of spaces 18 is circulated with one slit-shaped through hole 16. As shown in FIG. 9, the slit-shaped through holes 16 are staggered along the horizontal direction of the PDP 1. Further, as shown in FIG. 9, the rows of staggered slit-shaped through holes 16 may be provided in both the upper and lower portions of the chassis member 3. The shape and arrangement of the slit-shaped through holes 16 is one example, and it is needless to say that the shape and arrangement other than the foregoing may be used.

Thus, according to this embodiment, the slit-shaped through holes 16 can enhance the air circulation performance in the space 18 and thereby improve the radiation performance. That is, according to this embodiment, it is possible to efficiently radiate heat generated from the PDP 1 and excellently decrease the temperature of the PDP 1.

Figure 13:
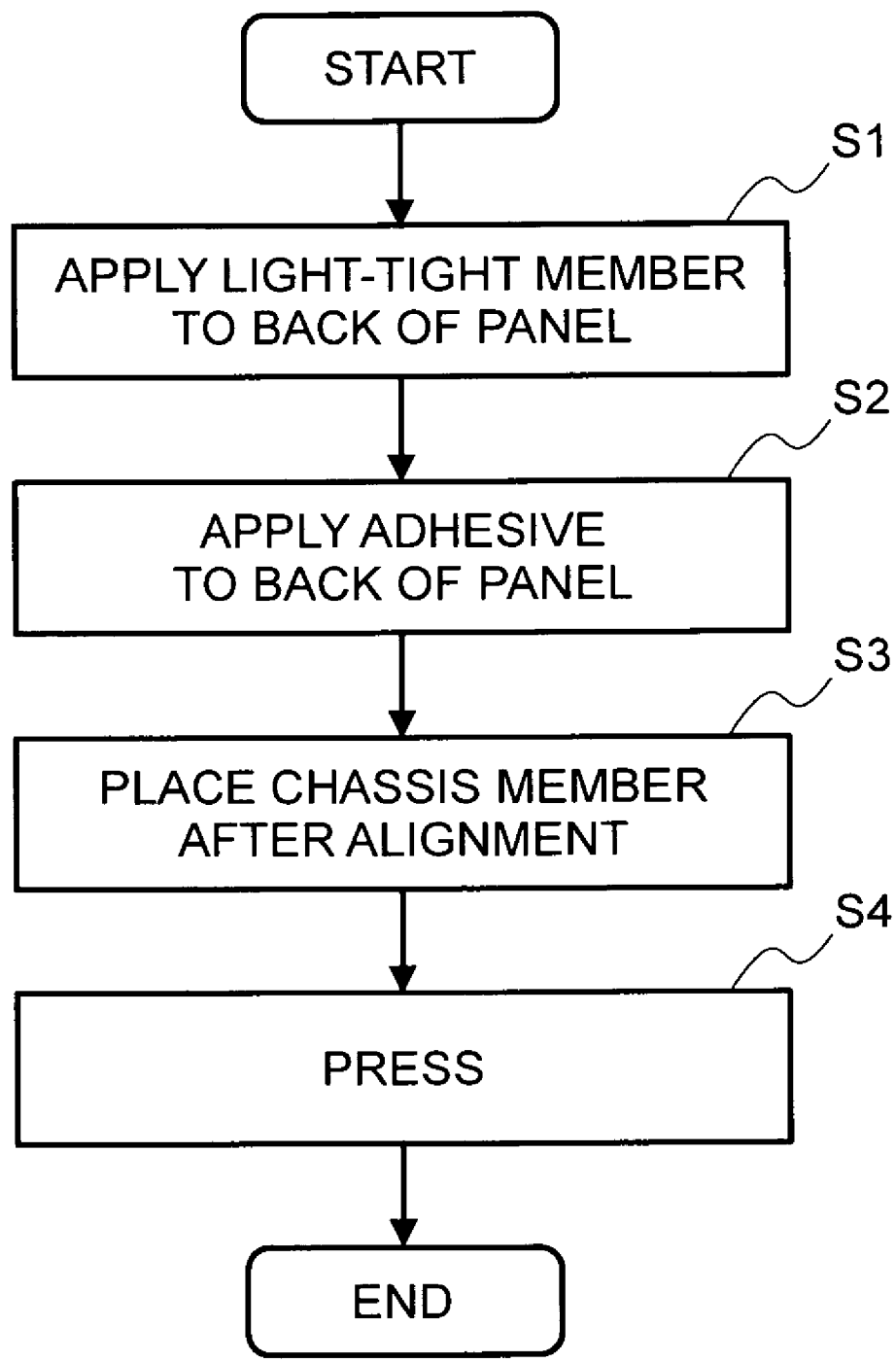
FIG. 13 is a flowchart showing a bonding process for bonding a PDP and a chassis member 3 together according to the fourth embodiment.

Next, a bonding process for bonding the PDP 1 and the chassis member 3 together according to the fourth embodiment will be described with reference to FIG. 13. FIG. 13 is a flowchart showing an example of the bonding process for bonding the PDP 1 and the chassis member 3 together according to the fourth embodiment. First, in step 1 of FIG. 13 (hereinafter step is abbreviated as "S"), the R-HM adhesive is applied over substantially the entire back surface of the PDP 1, using a hot spray gun. Next, in step 2, the heat conducting sections of the HM adhesive AL are applied to the back of the PDP 1 in reed shapes with a predetermined space therebetween as shown in FIG. 2, using a hot dispenser. The hot dispenser (not shown) has a plurality of nozzles and performs coating at a predetermined moving speed, with the nozzles spaced about 2 mm from the back of the PDP. The use of a plurality of nozzles (not shown) makes it possible to perform coating at a time, thus reducing process time and cost. Next, the chassis member 3 is placed on the PDP 1 coated with the HM adhesive AL while alignment (position adjustment) is being performed (S3). Further, the chassis member 3 is heated preferably to temperatures of 60 to 80° C. on the press surface and pressed for a predetermined time period for pressure bonding (S4). Then, the bonding process ends. Since the HM adhesive reaches a rubbery state within a short time (e.g., several seconds), it is possible to reduce coating-bonding process time and cost. In FIG. 13, the PDP 1 coated with the HM adhesive is bonded to the chassis member 3, but the invention is not limited thereto. For example, the chassis member 3 coated with the HM adhesive may be bonded to the PDP 1.

Fifth Embodiment

Figure 12:
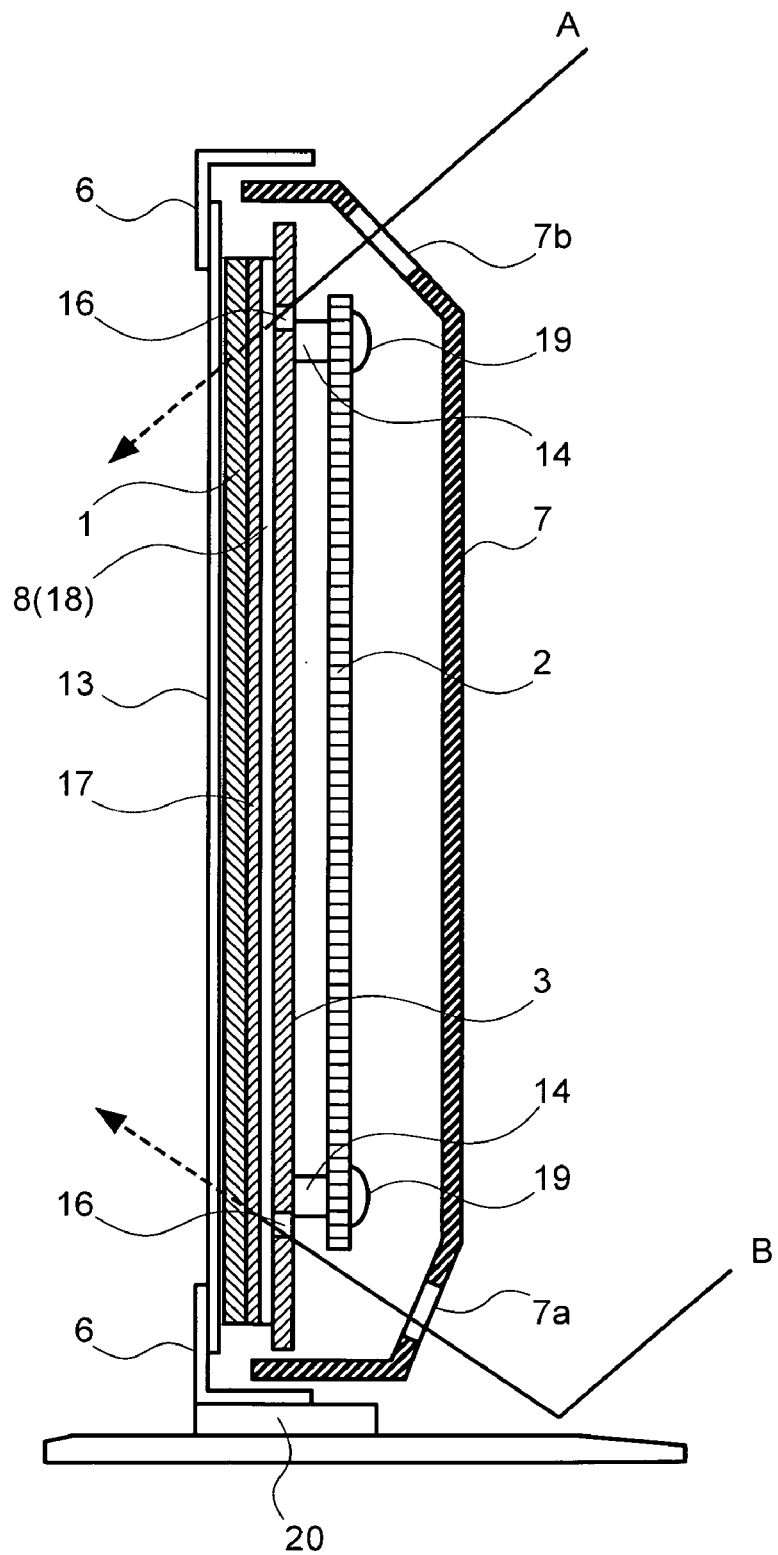
FIG. 12 is a sectional view of a plasma display apparatus according to a fifth embodiment of the invention.

FIG. 12 is a sectional view of a plasma display apparatus according to a fifth embodiment of the invention. In this embodiment, a rear cover 7 is provided so as to cover the back of a PDP 1 and a chassis member 3, and an air intake hole 7a and an exhaust hole 7b are formed in the rear cover 7. A stand 20 is used to support the entire plasma display apparatus from the bottom. The circuit boards 2 shown in FIG. 1 are secured to the chassis member by mounting bosses 14 and mounting screws 19. In this embodiment, air (outside air) is taken into the apparatus through the air intake hole 7a using a fan (not shown) so as to cool the chassis member 3, the circuit boards 2, and the like. The air that has cooled each unit is exhausted outside the apparatus through the exhaust hole 7b. Usually, in view of air convection, the air intake hole 7a is provided in the lower part of the apparatus, and the exhaust hole 7b is provided in the upper part of the apparatus. As a matter of course, they may be arranged contrary thereto.

In this embodiment, air taken in through the air intake hole 7a provided in the rear cover 7 flows into the space 18 through a slit-shaped through hole 16. The air heated by cooling the PDP 1 etc. in the space 18 is exhausted outside the chassis member 3 through a slit-shaped through hole 16, and further exhausted outside the apparatus through the exhaust hole 7b. Therefore, according to this embodiment, since outside air can be efficiently taken into the space 18, it is possible to cool the PDP 1 more efficiently than in the first embodiment. The velocity of flow of air in the space 18 (space between adhesives) is about 200 mm/second, obtained by thermo-fluid analysis. Thus, it has been confirmed that air convection has occurred in the space 18 though it is a slight amount.

In this embodiment, as shown in FIG. 12, there are cases where outside light comes in through the air intake hole 7a and the exhaust hole 7b of the plasma display apparatus. The outside light includes illumination light in a room where the plasma display apparatus is installed, reflection light of the illumination light reflected by a wall behind the apparatus, and light from a lighting fixture as an interior installed behind the apparatus. The light that has come in through the air intake hole 7a and the exhaust hole 7b passes through the slit-shaped through holes 16 (arrows A and B in FIG. 12). However, since the light-tight member 17 is applied over the entire back surface of the PDP 1 as described above, the outside light is greatly attenuated when reaching the back of the PDP 1. This prevents an extraordinary bright part from being formed on the display screen.

As has been described, according to the embodiments, since a plurality of through holes are provided in the chassis member 3, it is possible to improve heat radiation efficiency in the plasma display apparatus constructed by bonding the PDP 1 and the chassis member 3 together. Further, in the embodiments, since the hot-melt adhesive is used as the heat conductive member and the amount of usage of the hot-melt adhesive as the heat conductive member can be reduced, it is possible to bond the flat display panel and the chassis member together within a short time and thereby reduce costs. Further, the use of the HM adhesive as the heat conductive member can reduce coating-bonding process time and cost. Furthermore, arranging the reed shapes as the coating shape with a predetermined space therebetween can reduce the amount of usage of the HM adhesive.

What is claimed is:

1. A flat-panel display apparatus comprising:
a display panel;
a metallic chassis member; and
a bonding member for bonding a back of the display panel and the chassis member together;
wherein the bonding member is a hot-melt adhesive having adhesion at ordinary temperature and filled with a heat conduction imparting agent, the thickness of the bonding member is 0.3 to 0.8 mm, and a plurality of the bonding members are arranged discretely in a horizontal direction of a screen of the display panel so as to be spaced from one another;
wherein a width of the space between at least two adjacent bonding members in the horizontal direction is not greater than 10 mm and a width of the at least two adjacent bonding members in the horizontal direction at at least one part of the screen is approximately equal to the width of the space therebetween.

2. The flat-panel display apparatus according to claim 1, wherein the bonding members are shaped like stripes extending in a vertical direction of the screen.

3. The flat-panel display apparatus according to claim 2, wherein the stripe-shaped bonding members are arranged with the space therebetween in the horizontal direction corresponding to a long side of the screen of the display panel and arranged to extend substantially parallel to the vertical direction corresponding to a short side of the screen of the display panel, and
the width of the space is larger at sides of the screen laterally away from the center of the screen than that at the center of the screen of the display panel.

4. The flat-panel display apparatus according to claim 2, wherein the stripe-shaped bonding members are arranged with the space therebetween in the horizontal direction corresponding to a long side of the screen of the display panel and arranged to extend substantially parallel to the vertical direction corresponding to a short side of the screen of the display panel, and
the width of the bonding members is smaller at sides of the screen laterally away from the center of the screen than that at the center of the screen of the display panel.

5. The flat-panel display apparatus according to claim 1, wherein the display panel is a plasma display panel.

6. The flat-panel display apparatus according to claim 1, wherein the plurality of bonding members are arranged on the back of the display panel so as to delimit the space therebetween in which air is enabled to be circulated.

7. A flat-panel display apparatus comprising:
a display panel;
a metallic chassis member; and
a heat conductive bonding member for bonding a back of the display panel and the chassis member together;
wherein a plurality of the bonding members are arranged discretely as stripe-shaped bonding members spaced from one another in a horizontal direction of a screen of the display panel and extending in a vertical direction of the screen over at least a center portion of the back of the display panel;
wherein a width of the space between at least two adjacent bonding members in the horizontal direction is not greater than 10 mm and a width of the at least two adjacent bonding members in the horizontal direction at at least one part of the screen is approximately equal to the width of the space therebetween; and
the chassis member is provided with a plurality of through holes through which air is circulated at least in the space formed between the bonding members at least arranged at the center portion of the back of the display panel.

8. The flat-panel display apparatus according to claim 7, wherein the bonding members extend over a substantial portion of the entirety of the back of the display panel.

9. The flat-panel display apparatus according to claim 8, wherein each of the through holes is formed extending in a direction perpendicular to a longitudinal direction of the bonding members.

10. The flat-panel display apparatus according to claim 8, wherein each of the through holes is formed in a rectangular shape whose longitudinal direction is perpendicular to a longitudinal direction of the bonding members.

11. The flat-panel display apparatus according to claim 8, wherein the plurality of through holes are staggered in a direction perpendicular to a longitudinal direction of the bonding members.

12. The flat-panel display apparatus according to claim 7, further comprising:
a rear cover disposed so as to cover the back of the chassis member;
wherein the rear cover is provided with at least one air circulation hole, and air is taken into and exhausted from at least the space formed between the bonding members, through the at least one air circulation hole of the rear cover and the through holes of the chassis member.

13. The flat-panel display apparatus according to claim 12, wherein at least an upper part and a lower part of the rear cover are each provided with the air circulation hole.

14. The flat-panel display apparatus according to claim 7, wherein each of the bonding members has a thickness of 0.3 to 0.8 mm.

15. A flat-panel display apparatus comprising:
a display panel;
a metallic chassis member; and
a bonding member for bonding a back of the display panel and the chassis member together;
wherein the bonding member is a hot-melt adhesive having adhesion at ordinary temperature and filled with a heat conduction imparting agent, a plurality of the bonding members are arranged discretely in a horizontally direction of a screen of the display panel on the back of the display panel so as to be spaced from one another;
wherein a width of the space between at least two adjacent bonding members in the horizontal direction is not greater than 10 mm and a width of the at least two adjacent bonding members in the horizontal direction at at least one part of the screen is approximately equal to the width of the space therebetween; and
wherein the chassis member is provided with a plurality of through holes to enable air to flow at least one of into and from at least the space between the bonding members.

16. The flat-panel display apparatus according to claim 15, wherein the bonding members are shaped like stripes extending in a vertical direction of the screen.

17. The flat-panel display apparatus according to claim 15, wherein a light-tight member is applied over substantially the entire back surface of the display panel.

18. The flat-panel display apparatus according to claim 17, wherein the light-tight member has a transmittance of 20% or less.

19. The flat-panel display apparatus according to claim 15, wherein the display panel is a plasma display panel.

20. The flat-panel display apparatus according to claim 15, wherein each of the bonding members has a thickness of 0.3 to 0.8 mm.

* * * * *